United States Patent [19]

Currie et al.

[11] Patent Number: 5,230,097
[45] Date of Patent: Jul. 20, 1993

[54] OFFSET FREQUENCY CONVERTER FOR PHASE/AMPLITUDE DATA MEASUREMENT RECEIVERS

[75] Inventors: Charles H. Currie, Doraville; Owen M. Caldwell, Dunwoody, both of Ga.

[73] Assignee: Scientific-Atlanta, Inc., Norcross, Ga.

[21] Appl. No.: 491,161

[22] Filed: Mar. 9, 1990

[51] Int. Cl.$^5$ ............................................. H04B 17/00
[52] U.S. Cl. ................................. 455/226.1; 455/259; 455/315; 455/319; 455/324; 331/2
[58] Field of Search ............................... 455/264–265, 455/259, 318–319, 316, 323, 324, 208–209, 314–315; 331/2, 25

[56] References Cited

U.S. PATENT DOCUMENTS

| | | | |
|---|---|---|---|
| 3,950,750 | 4/1976 | Churchill et al. | |
| 4,152,652 | 5/1979 | Taylor et al. | 455/226 |
| 4,584,710 | 4/1986 | Hansen | 455/226 |
| 4,776,032 | 10/1988 | Odate et al. | 455/10 |
| 4,944,025 | 7/1990 | Gehring et al. | 455/264 |

FOREIGN PATENT DOCUMENTS 0018823  1/1988  Japan .................... 455/314

OTHER PUBLICATIONS

Scientific Atlanta, description of Scientific-Atlanta Series 1780 programmable Microwave Receiver, "Antenna and RCS Instrumentation Products", 1990, pp. 38-50.
Scientific Atlanta, description of the Model 1795 microwave receiver, "Antenna and RCS Instrumentation Products", 1990, pp. 51-55.
Scientific-Atlanta, "Highspeed Measurement Receiver Improves Antenna Range Productivity", Microwave Journal, Mar. 1989, vol. 32, No. 3. pp. 163-170.
Churchill et al., "The Correction of I and Q Errors in a Coherent Processor", IEEE Trans. Aerospace and Electronic Systems, vol. AES-17, No. 1 (Jan. 1981), pp. 131-137.
Operating and Service Manual for the HP8510 Network Analyzer, pp. 8-275/8-276 pp. 8-241/8-242 (date unknown, but more than one year before filing date hereof).
Maintenance Manual for the Scientific Atlanta Series 1780 Programmable Microwave Receiver, Part I (1984), pp. 4-85-4-90.
Oliver and Cage, "Chopper Amplifiers", Electronic Measurements and Instrumentation, pp. 204-209, McGraw-Hill Book Company (1971).

Primary Examiner—Reinhard J. Eisenzopf
Assistant Examiner—Andrew Faile
Attorney, Agent, or Firm—Jones & Askew

[57] ABSTRACT

An offset frequency converter for the intermediate frequency (IF) stages of a multi-channel radio frequency (RF) phase/amplitude measurement receiver, particularly useful for measuring the performance characteristics of antennas. The converter allows use of noncoherent transmitter and receiver local oscillator sources which utilize digital frequency synthesizers and enables harmonic mixing to be employed when the tuning resolution of the receiver local oscillator is incremental. The converter samples an incoming first intermediate frequency signal $IF_1$ in a reference channel, which typically is obtained by mixing an LO source in the receiver with an incoming signal from a reference antenna. The $IF_1$ sample is then upconverted with an upconversion signal to a higher frequency, filtered, and the downconverted with a downconversion signal to an $IF_1 + IF_2$ signal offset from the $IF_1$ sample by a lower second intermediate frequency $IF_2$. The added frequency offset $IF_2$ is derived from a time stabilized source independent of the transmitter but coherent with the receiver LO. The mixed $IF_1 + IF_2$ signal is heterodyned with signals in both the signal channel from the antenna under test and the reference channel to obtain coherent outputs at $IF_2$ which differ by phase and magnitude corresponding to the characteristics of the antenna under test. The circuit exhibits high frequency agility and obviates the need for coherency between the receiver LO and transmitter LO.

53 Claims, 6 Drawing Sheets

OFFSET FREQUENCY CONVERTER FOR PHASE/AMPLITUDE DATA MEASUREMENT RECEIVERS

TECHNICAL FIELD

The present invention relates generally to radio frequency (RF) receivers, and more particularly relates to improvements for the intermediate frequency (IF) stages in a RF measurement receiver which allow use of noncoherent, synthesized transmitter and receiver local oscillator frequency sources and permit the receiver to employ harmonic mixing when the receiver local oscillator frequency resolution is limited by the synthesizer. These improvements are particularly advantageous in systems for measuring the performance characteristics of antennas.

BACKGROUND

Modern microwave radar and communication systems rely heavily on the performance characteristics of antennas. Continuing advancements in antenna design have resulted in improvements in these systems and have challenged instrumentation manufacturers to provide instruments that can accurately measure the performance characteristics of new antenna designs, such as multibeam antennas, electronically steered phased arrays, dual-polarized and shaped-beam reflectors, and low sidelobe and broadband omnidirectional antennas.

Antenna testing is a multidimensional measurement problem. The received signal from an antenna under test ("AUT") is a complex signal. It is a function of the antenna's frequency, beam position for steered-beam arrays, polarization, spatial position (such as azimuth and elevation angles), and other parameters. The received phasor's amplitude and phase components are principal parameters of operation which are recorded as a function of position and other pertinent test parameters such as frequency and polarization.

In a measurement receiver, it is the principal object to measure the signal amplitude and the phase difference between a signal channel connected to the AUT, and a reference channel connected to a fixed, reference antenna which does not move relative to the transmitter field. Often, measurement values are complex quantities expressed in rectangular form, with an inphase component (I) and a quadrature phase component (Q), which are 90° out of phase with respect to each other.

Reducing the time required to take an individual measurement is governed by a measurement receiver's acquisition speed and AUT positioner speed. Since antenna test positioners have limits on rotational speed, improvements in antenna range productivity are achieved primarily by enhancing receiver performance characteristics. The major receiver characteristics affecting antenna measurements include measurement speed, frequency agility (the ability to change frequencies rapidly while remaining in lock), dynamic range, interface compatibilities with computer-controlled systems, the number of measurement channels, and remote control capability.

Measurement speed is the rate at which a receiver can acquire, process, and output formatted data. The apparent speed of many conventional receivers is usually fast enough that the measurement processing time is transparent to an operator. However, actual receiver speed becomes apparent when repetitive tasks are performed, such as in multifrequency or multiported measurements wherein the frequency can be changed more rapidly than measurements can be processed and provided as outputs.

Fast, coherent, wideband measurements require that a receiver remain phase-locked to the transmit source at all times. A receiver's frequency agility characterizes its ability to maintain phase-lock when encountering rapid frequency transitions. However, particular problems have been encountered in the design of measurement receivers which provide both an acceptable response time and frequency agility.

In such antenna pattern measurement receivers, the magnitude and phase relationships between the signal channel and the reference channel are crucial. In order for this phase/amplitude relationship to be accurately measured, the receiver must be coherent with or locked to a stable time-based reference signal (not to be confused with the signal in the reference channel). In some prior art antenna pattern measurement receivers, the oscillator for the transmitter and the local oscillator for the receiver were phase locked to a common frequency source, and programmed for an intermediate frequency (IF) separation of, for example, 45 MHz. Then, utilizing conventional signal processing techniques, the phase of a 45 MHz IF signal is measured relative to a 45 MHz IF reference channel. In addition, the amplitude is determined by conventional means.

This prior art approach with a common frequency reference source, however, requires a cable or other communication link extending between the AUT's transmitter and the local oscillator of the measurement receiver. Needless to say, it is not always convenient or desirable to require a communication link between transmitter and receiver to maintain oscillator coherency. Moreover, the requirement for coherency limits the use of the measurement receiver to environments wherein such links can be made and precludes testing or measurement of hostile AUTs in the field.

Another difficulty has been encountered in applying new technologies to receivers which utilize this prior art technique. In particular, difficulties have arisen with the use of frequency synthesizers as frequency sources in local oscillator (LO) stages of the receiver. Typical modern frequency synthesizers are digitally controlled and operate in discrete steps of a predetermined frequency interval, for example, 10 kHz, instead of continuous tuning. Many modern RF receivers now utilize both fundamental and harmonic mixing to obtain wideband operation, for example over the RF range of 2-18 GHz, a local oscillator covering 2.0 to 4.6 GHz is used. Unfortunately, if harmonic mixing is to be used with an LO having a digital frequency synthesizer programmable in discrete steps, it may not be possible to select a synthesizer frequency which will harmonically mix with the signal frequency and result in the exact intermediate frequency required.

For example, assume a receiver frequency of 3956 MHz, an LO frequency range of from 1000 MHz to 2200 MHz with a limited tuning resolution of 1.0 MHz and an IF of 45 MHz. Utilizing harmonic mixing it will be seen that the second harmonic of an LO frequency of 2000 MHz is 4000 MHz, which will give an IF of 44 MHz (4000−3956). A 1.0 MHz higher frequency (2001 MHz) gives a second harmonic of 4002 MHz, which results in an IF frequency of 46.0 MHz (4002−3956). The required LO frequency of 2000.5 MHz (0.5×4001) cannot be programmed due to the limited resolution of the synthesizer. The IF error in this example is 1.0 MHz, and at higher harmonics the difficulty is further magnified. The actual maximum error encountered is one-half the synthesizer resolution times the mixer operating harmonic number.

Yet another problem encountered in utilizing the conventional prior art approach of a phase locked loop at high RF frequencies with coherent receiver and transmitter sources is frequency switching rate. Systems which utilize an RF phase locked loop typically have limited frequency switching rate capability because of the response characteristics of the phase locked loop. In other words, such prior art systems are generally incapable of switching rates in excess of about 100 frequencies per second. However, modern systems while utilize frequency synthesizers for transmitter sources are capable of frequency switching at rates much higher than this, and it is highly desirable to be able to test systems utilizing such frequency sources.

Accordingly, there is still need for further improvements in radio frequency receivers used in radar, antenna testing, and communications applications, namely, in methods for allowing use of frequency synthesizers as sources for both transmitters and receivers, and noncoherent sources for both transmitter and receiver.

SUMMARY OF THE INVENTION

The present invention overcomes these and other problems encountered in prior art measurement receiver IF stages by employing a fast responding dual conversion system to add a time-stable offset frequency to the reference channel first IF signal. This frequency offset IF signal is split, amplified and supplied as the LO signal to signal channel and reference channel second converters, resulting in the conversion of signal and reference channel IF signals to a second IF coherent with the time-stable IF offset frequency. Further processing of the second IF signals results in signal channel amplitude data and phase data (signal channel phase relative to reference channel phase). In particular, the invention allows phase and amplitude measurements to be made in a measurement receiver on an antenna measurements range employing a frequency-synthesized transmitting source which need not be coherent with a frequency-synthesized local oscillator (LO) in the receiver used for data collection.

Briefly described, the present invention comprises an offset frequency converter responsive to a reference channel first intermediate frequency signal ($IF_1$) and a stable clock reference signal (REF $IF_2$) to provide a mixed output signal which is the sum of $IF_1$ and $IF_2$. The resulting ($IF_1+IF_2$) output signal is processed and supplied as a second LO signal to convert the signal channel and reference channel first IF signals to second IF signals ($IF_2$) coherent with the REF $IF_2$ reference frequency and with each other. The preferred embodiment of the offset frequency converter includes an oscillator circuit which provides an upconversion LO signal and a coherent downconversion LO signal. The downconversion LO signal is higher in frequency than the upconversion LO signal by the clock reference signal REF $IF_2$. A frequency converter circuit responsive to the upconversion LO signal, the downconversion LO signal, and the input signal provides the mixed output signal at a stable frequency of $IF_1+IF_2$.

The invention allows use of a frequency synthesizer-based local oscillator in a multi-channel phase/amplitude RF receiver which is not coherent with a frequency synthesizer-based transmitting source, which can change frequencies at a rapid rate. The preferred offset frequency converter provides a stable coherent mixed signal $IF_1+IF_2$ locked to the frequency of the reference signal channel, where the $IF_2$ difference signal frequency is maintained notwithstanding frequency shifts which may occur at the first intermediate frequency $IF_1$ due to use of harmonic mixing with signals generated by a digital frequency synthesizer in the LO stage, or due to the noncoherency between the LO in the receiver and the frequency of the transmitter.

More particularly described, the preferred offset frequency converter includes means for sampling the incoming reference channel signal ($IF_1$) and coupling this signal through a limiting amplifier to the offset frequency converter, together with means for providing a stable second intermediate frequency reference REF $IF_2$ from a clock source. Typically, the clock source REF $IF_2$ will be located in the receiver and will be coherent with the synthesized first LO at $IF_1$. The offset frequency converter supplies a single output frequency which is the sum of $IF_1$ and $IF_2$. The signal $IF_1+IF_2$ is split and supplied to $IF_1$ SIG and $IF_1$ REF downconverters associated with both the signal channel and reference channels, respectively, of the receiver. This provides as an output a coherent second intermediate frequency $[(IF_1+IF_2)-IF_1]$ or $IF_2$. The $IF_2$ output signal is constant for changes of $IF_1$ within a predetermined operating range for the offset frequency converter, namely, about $IF_1 \pm 1$ MHz. In addition, the response time of the offset frequency converter is sufficient to permit very high frequency agility, which is greater than 5000 frequencies per second.

Still more particularly described, the preferred offset frequency converter comprises, in the oscillator circuit, two crystal stabilized oscillators which are phase-locked together with a frequency difference of 100 kHz. The oscillator frequencies are 120.0 MHz and 120.1 MHz. The frequency converter stage then receives a reference channel input signal sample, for example a signal in the range of $45\pm0.5$ MHz, which is first upconverted to $75\pm0.5$ MHz. The 120.0 MHz oscillator is the local oscillator frequency for the upconverter.

The $75\pm0.5$ MHz signal is then filtered, amplified, and supplied as an input to a downconverter circuit in the frequency converter stage. The local oscillator signal for the downconverter is the 120.1 MHz oscillator output. This provides an output $45.1\pm0.5$ MHz signal which is filtered, amplified, and supplied as a signal for heterodyning with the reference channel signal and the signal channel signal, to obtain second IF signals of 100 kHz which are frequency coherent and thus which differ only in phase and magnitude.

The present invention further utilizes extensive interstage filtering and isolation to provide an output signal free down approximately 100 db of the $45\pm0.5$ MHz input signal ($IF_1$) as well as any unwanted converter beat frequencies.

Accordingly, it is an object of the present invention to provide an improved IF processing system for an RF phase/amplitude antenna pattern measurement receiver.

It is another object of the present invention to provide an improved RF measurement receiver which is capable of operation with a non-coherent transmitting and receiver local oscillator sources.

It is another object of the present invention to provide an improved phase/amplitude antenna pattern measurement receiver for use in antenna testing applications which is operative with digital frequency synthesizer-based transmitter and receiver local oscillator sources.

It is another object of the present invention to provide an improved RF receiver which allows utilization of harmonic mixing in the receiver when using a frequency synthesizer-based local oscillator which operate in discrete frequency step sizes.

It is another object of the present invention to provide an improved RF receiver which is capable of operation with frequency synthesizers as a LO source but which also possesses high frequency changing agility.

It is another object of the present invention to provide an improved antenna measurement receiver which permits coherent operation at frequency agile rates limited only by response bandwidth and signal and propagation delay characteristics of the receiver and the frequency switching time of the frequency synthesizers utilized in the local oscillator.

It is another object of the present invention to provide an improved RF receiver especially for use in antenna measurement application which does not require the use of a phase locked loop in the RF band between the receiver and a transmitter.

These and other objects, features, and advantages of the present invention may be more clearly understood and appreciated from a review of the following detailed description of the disclosed embodiment and by reference to the appended drawings and claims.

BRIEF DESCRIPTION OF THE DRAWING FIGURES

DETAILED DESCRIPTION OF THE PREFERRED EMBODIMENT

Figure 1:
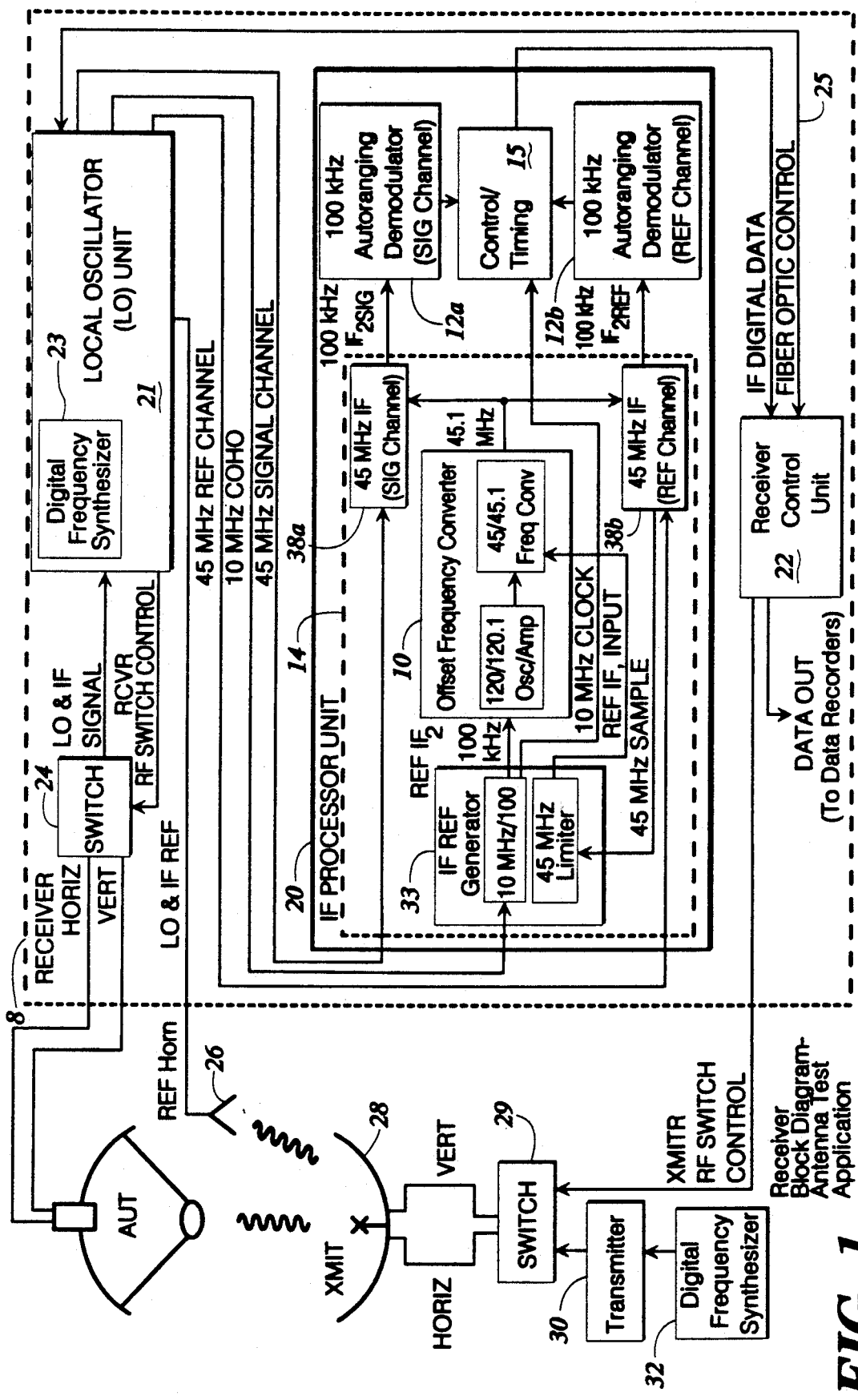
FIG. 1 is a block diagram of a two-channel radio frequency phase/amplitude measurement receiver utilized in an antenna test configuration which includes an offset frequency converter constructed in accordance with the preferred embodiment of the present invention.

Referring now to the drawings, in which like numerals indicate like elements throughout the several drawing figures, FIG. 1 shows a radio frequency (RF) high speed measurement receiver 8 which includes an offset frequency converter circuit 10 constructed in accordance with the present invention. The offset frequency converter 10 is included within an intermediate frequency (IF) processing unit 20, which includes a number of other components which do not form a part of the present invention. The complete receiver 8 further includes a local oscillator (LO) unit 21 and a receiver control unit 22 which are interconnected in the manner to be described. The LO unit may include a digital frequency synthesizer 23 as the frequency source.

The offset frequency converter 10 permits the receiver 8 to be operated in a test system using non-coherent synthesized sources for the transmitter source and for the receiver LO unit 21. The synthesized sources are each programmed to an appropriate frequency to provide a 45.0 MHz IF signal in the receiver. The offset frequency generator 10 compensates for small frequency differences between the synthesized sources which are due to limited programming resolution and differences in reference oscillator frequencies.

The transmitter source and the receiver can be operated apart at great distances without need for a common RF reference cable. The frequency synthesizers employed in the system may be the direct type such as a Comstron 2000 or Scientific-Atlanta 1796A.

By way of background, the receiver 8 is shown in FIG. 1 connected to an antenna under test (AUT), which is typically mounted in an antenna testing range for performance testing. The receiver 8 comprises a high speed, high accuracy, coherent A/D conversion system for RF signals such as microwave signals. Coherent detection results from providing completely separate but coherent signal and reference channels. An LO unit 21 provides a local oscillator signal that ranges from 1.9 to 4.6 GHz in the preferred embodiment, and provides a resulting first IF frequency of 45 MHz. The 45 MHz IF signals are amplified and buffered in the LO unit 21 and transmitted to an IF processor 20, where they are further amplified and downconverted to a second IF frequency (IF$_2$) of 100 kHz. Then, the 100 kHz IF signals are autoranged, synchronously detected using an internal high stability time base, transformed into quadrature signals I and Q, and converted to digital format for utilization by a receiver control unit 22. Digital data corresponding to the phasor values of the signal and reference channels are generated by 100 kHz autoranging demodulator circuits 12a and 12b for the signal and reference channels, respectively, and a control/timing circuit 15 in the IF processor 20 and sent as the signal IF DIGITAL DATA to the receiver control unit 22.

In FIG. 1, horizontal and vertical polarization antenna elements in the AUT provide a horizontally polarized input signal HORIZ and a vertically polarized input signal VERT to an RF switch 24, which switches between the two polarized signals under control of a signal RCVR RF SWITCH CONTROL provided by the LO unit 21. The incoming signal from the switch 24 comprises a LO and IF SIGNAL provided to the LO unit 21. The LO unit 21 in the preferred embodiment may be remotely located so as to preserve the sensitivity and dynamic range features desired in antenna range installations. Typically, a user of the system may elect to place the LO unit 21 as close to the AUT as is practicable. The LO unit 21 is controlled by a fiber optic control line 25 between a receiver control unit 22, allowing separation up to 2000 feet between the LO unit and other parts of the receiver.

Also connected to the LO unit 21 is a reference antenna horn 26, which is typically positioned at a stationary location in the antenna range and which receives a constant reference signal from a transmitter antenna 28. The signal from the reference antenna 26 is denominated LO and IF REF which is provided to the LO unit 21.

The transmit antenna 28 provides selectable horizontally and vertically polarized transmitted signals, denominated HORIZ and VERT, which are provided from an RF switch 29. The receiver control unit 22 provides a signal XMITR RF SWITCH CONTROL which switches between horizontal and vertical polarizations to the transmitting element in the antenna 28, from a transmit signal source 30, typically an RF transmitter amplifier. The transmitter 30 may include a digital frequency synthesizer 32 as the frequency source, and in accordance with the present invention, need not be frequency coherent with the LO 21 in the receiver 8.

The primary function of the IF processor unit 20 is to provide two stages of intermediate frequency downconversion for the receiver, so as to obtain a 100 kHz reference signal channel REF from the reference horn 26 and a 100 kHz signal channel SIG from the AUT. The LO unit 21 provides outputs comprising a 45 MHz REF CHANNEL, a 45 MHz SIGNAL CHANNEL, and a coherent oscillator signal 10 MHz COHO to the IF processor unit. Details of the LO unit 21 are not considered part of the present invention, and will not be discussed further herein, except to say that the preferred LO unit 21 may include a digital frequency synthesizer 23 as its frequency source.

The IF processor unit 20 further comprises other elements comprising a first IF subsystem 14, including an intermediate frequency reference generator 33, which divides down the coherent clock signal 10 MHz COHO provided from the LO unit and provides a precision stable time base 10 MHz CLOCK signal to the control/timing circuit 15.

The IF reference signal generator 33 also provides a highly stable 100 kHz signal to the offset frequency converter 10, denominated REF IF$_2$. The offset frequency converter 10 is responsive to the signal REF IF$_2$ to generate a 45.1 MHz signal that is provided to 45 MHz IF downconverters 38a, 38b, for the signal and reference channels, respectively, whose outputs are the 100 kHz second intermediate frequency signals for the signal and reference channels, IF$_{2SIG}$ and IF$_{2REF}$, respectively, the phase and amplitude therebetween which are the subjects of measurement by the receiver 8.

The 100 kHz second intermediate frequency signals for the signal and reference channels, IF$_{2SIG}$ and IF$_{2REF}$, from the downconverters 38 are processed into inphase (I) and quadrature (Q) digital values by the autoranging demodulators 12 and control/timing circuit 15, whose output is IF DIGITAL DATA. Details of the operation of the autoranging demodulators 12 and control/timing circuit 15 will not be described further herein, inasmuch as the same is described in copending application Ser. No. 07/491,186, filed Mar. 9, 1990, U.S. Pat. No. 5,125,008 entitled "Method and Apparatus for Autoranging, Quadrature Signal Generation, Digital Phase Reference, and Calibration in a High Speed RF Measurement Receiver" and owned by the same assignee as the present invention, which is incorporated herein by reference and made a part hereof as if the same were set forth fully herein.

The digital results IF DIGITAL DATA are then transferred out of the IF processor unit 20 to the receiver control unit 22 for further processing, display and output. The receiver control unit 22 provides as outputs 5000 samples per second for the signal and reference channel. Amplitude and phase or I and Q outputs are provided in digital form as DATA OUT in a variety of floating point numerical formats for further calculations and display. The receiver control unit 22 also provides controller interfaces such as an IEEE-488 bus, RS232/449 serial interfaces, a BCD recorder, and the like. The control unit utilizes high speed digital signal and floating point processors to receive the raw data signals and apply calibration corrections, numerical conversions, coherent averaging, and normalizations in real time. The resulting formatted data is available to a user directly from the control unit 22 via a fast parallel interface and is also distributed inside the control unit for display and output via the 488 bus, serial, and BCD recorder interfaces. Inasmuch as the details of the preferred receiver control unit do not form part of the present invention, the same will not be discussed further herein.

It should be understood that the offset frequency converter 10 of the present invention is operative to provide a 45.1 MHz LO signal to both downconverters 38a and 38b. The 45.1 MHz LO signal comprises the 45 MHz REF CHANNEL, with a highly accurate 100 kHz frequency offset added thereto, so that highly accurate 100 kHz output signals will be provided by both downconverters 38 prior to conversion to digital outputs.

It should be further understood that the differences between the 100 kHz signals from the downconverters 38a and 38b are thus dynamically limited (i.e., within acceptable error tolerances) to the differences in phase and amplitude between the reference signal and the signal from the AUT, which reflect the measured parameters of the AUT. This dynamic limitation, which results from the operation of the preferred offset frequency converter 10, and allows the downstream portions of the receiver 8 to operate successfully, inasmuch as the 100 kHz signal REF IF$_2$ is derived from the 10 MHz CLOCK signal (which ultimately clocks the circuitry in the demodulators 12 and control/timing circuit 15). It will thus be understood that the precision of the 100 kHz signal frequency is of importance to operation of receiver, and contributes to the high levels of accuracy obtainable.

It will be noted in particular that there is no synchronization, communication, or coherency between the frequency synthesizer 32 in the transmitter 30 or and the synthesizer 23 in the LO unit 21, so that even if the exact same frequencies are selected, for example by the receiver control unit 22 for a testing situation, there will inevitably be some frequency difference and resultant phase error attributed to the antenna under test because of the fact that the frequency synthesizers are independent and remotely located from each other. It is this frequency difference which has been overcome with the present invention.

The primary function of the IF processor unit 20 is to provide intermediate frequency downconversion for the receiver 8, so as to obtain a 100 kHz reference channel signals $IF_{2SIG}$ and $IF_{2REF}$. These are derived from the outputs of the LO unit 21, which are a first intermediate frequency signal $IF_{1REF}$ in the 45 MHz REF CHANNEL, $IF_{1SIG}$ in the 45 MHz SIGNAL CHANNEL, and a coherent oscillator clock signal 10 MHz COHO.

Figure 2:
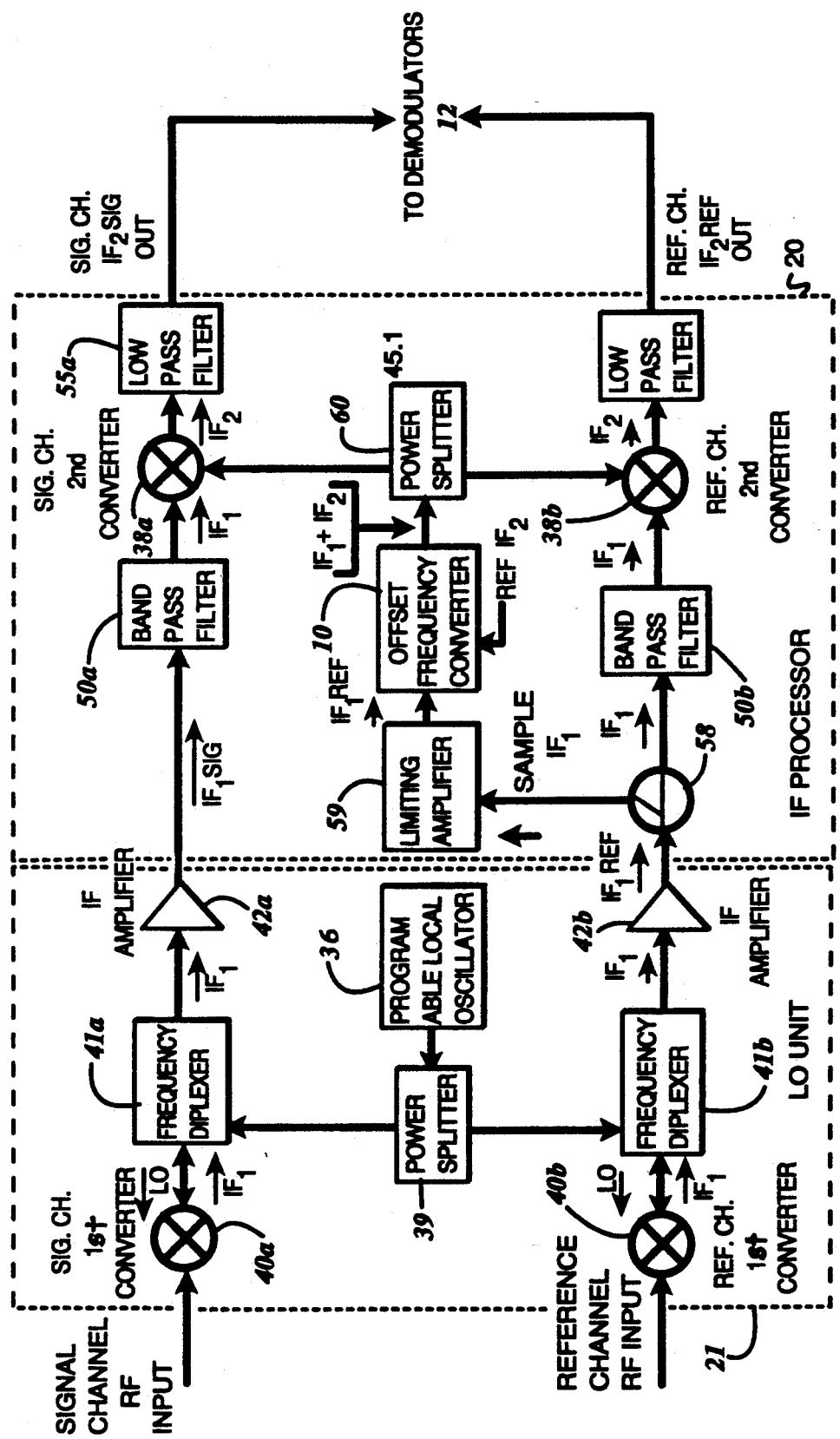
FIG. 2 is a block diagram of the LO unit and IF processor of the two-channel phase/amplitude receiver shown generally in FIG. 1, showing details of the manner of connecting the preferred offset frequency converter.

Turning then next to FIG. 2, the disclosed offset frequency converter 10 is located in the IF processor 20, which is connected to receive the signals in the signal channel $IF_{1SIG}$ and in the reference channel $IF_{1REF}$, both at the first IF frequency $IF_1$, from the LO unit 21. The signal from the antenna under test is first received at the LO unit 21 and provided as an RF input to a mixer 40a, preferably a two-port unbalanced mixer. The mixer 40a, preferably a type Scientific-Atlanta 14-11-20, receives a signal denominated LO from a power splitter 39, which in turn derives its signal from a programmable digital local oscillator 23. The mixer 40a mixes the LO signal with the incoming signal and provides out a first intermediate frequency $IF_1$ to a frequency diplexer 41a, which isolates the local oscillator signal LO and provides as an output only the intermediate frequency at $IF_1$, denominated $IF_{1SIG}$ for the signal channel. Although the preferred frequency diplexer 41 is part of an integrated RF subassembly manufactured by Scientific-Atlanta, it will be understood that conventional frequency diplexers can also be employed. While it will be understood that the method of the present invention can be applied to various ranges of RF signal to obtain various ranges of first intermediate frequencies $IF_1$, in the preferred embodiment the first intermediate frequency $IF_1$ is generally within the range of 44.5 MHz to 45.5 MHz.

The first intermediate frequency signal $IF_{1SIG}$ is provided to an intermediate frequency amplifier 42a where it is amplified for transmission to the IF processor 20, typically via a coaxial cable since the LO unit 21 may be remotely located up to 2000 feet away.

In similar fashion, the local oscillator signal LO from the programmable frequency synthesizer or local oscillator 23 is provided from the other side of the power splitter 39 to a similar two-port mixer 40b, frequency diplexer 41b, and IF amplifier 42b, to obtain a corresponding first intermediate frequency signal $IF_{2REF}$ for the reference channel.

Inside the IF processor 20, the intermediate frequency $IF_{1SIG}$ in the signal channel is first provided to a band pass filter 50a, where it is filtered at 45.0 MHz to remove any spurious out of band signals and out of band noise. After the filter 50a, it is provided to a balanced mixer 38a where it is mixed with mixing signal generated by the offset frequency converter 10, $IF_1+IF_2$, so as to provide the second intermediate frequency signal as an output to a low pass filter 55a which rejects signals above 200 kHz. The output of low pass filter 55a is the second intermediate frequency signal for the signal channel $IF_{2SIG}$ at 100 kHz which is then provided to the demodulator 12a (FIG. 1) for conversion to I and Q and digitization.

Similar circuitry 50b, 38b, 55b is provided for the reference channel signal $IF_{1REF}$, except that prior to bandpass filtering with filter 50b, a sample of the signal $IF_{1REF}$ is taken by a coupler 58, which is a type Mini Circuits TDC 10-1. The sample of $IF_{1REF}$ is then provided to a limiting amplifier 59 which limits excursions of the signal. The output of the amplifier 59, REF $IF_1$, is then provided to the offset frequency converter 10. The converter 10 then adds a stable second intermediate frequency signal at the chosen second intermediate frequency $IF_2$ from a stable reference source to REF $IF_1$ in the manner to be described. The output of the offset frequency converter 10 is the offset signal $IF_1+IF_2$, which is then provided to a power splitter 60 which feeds to both mixer/downconverters 38a, 38b. In the preferred embodiment, the offset frequency provided by the converter 10 is 45.1 MHz, although it will be appreciated that other frequencies could be utilized and generated.

Figure 3:
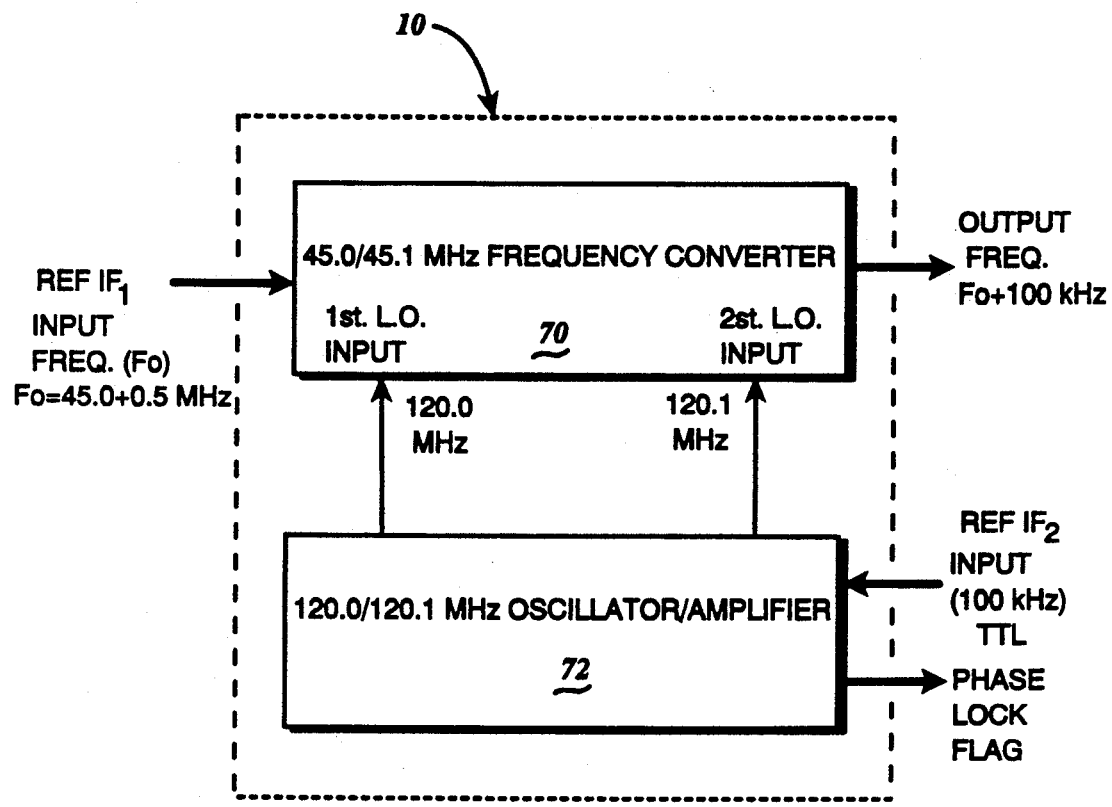
FIG. 3 is a block diagram of the preferred embodiment of the offset frequency converter constructed in accordance with the present invention.

Referring now to FIG. 3, it will be seen that the offset frequency converter 10 comprises two basic functional sections, a 45.0/45.1 MHz frequency converter 70, and a 120.0/120.1 oscillator/amplifier 72. The frequency converter 70 receives two LO inputs from the oscillator/amplifier 72, one in the form of a 120.0 MHz upconversion or first LO signal and the other in the form of a 120.1 MHz downconversion or second LO signal. If the input frequency of the frequency converter 70 is at an initial frequency $F_0$, the output frequency is $F_0$ plus 100 kHz, with $F_0$ in the preferred embodiment being in the range $45.0\pm0.5$ MHz.

The 120.0/120.1 MHz oscillator/amplifier 72 receives a highly stable reference input signal REF $IF_2$ at the second intermediate frequency $IF_2$, which is 100 kHz at TTL levels in the preferred embodiment. The circuit 72 provides, in addition to the 120.0 MHz and 120.1 MHz LO outputs, a phase lock flag indicative that the oscillator's internal phase locked loop is in lock. The phase lock flag is provided as a status output signal in digital form to other circuitry associated with the receiver or receiver control unit (not illustrated), which can utilize the signal to determine when the outputs have stabilized and the output frequency is the valid $F_0+100$ kHz signal.

The offset frequency converter 10 constructed in accordance with the present disclosure has a response bandwidth of 3.0 MHz or greater, enabling the converter to respond to rapid changes in input frequency.

Figure 4:
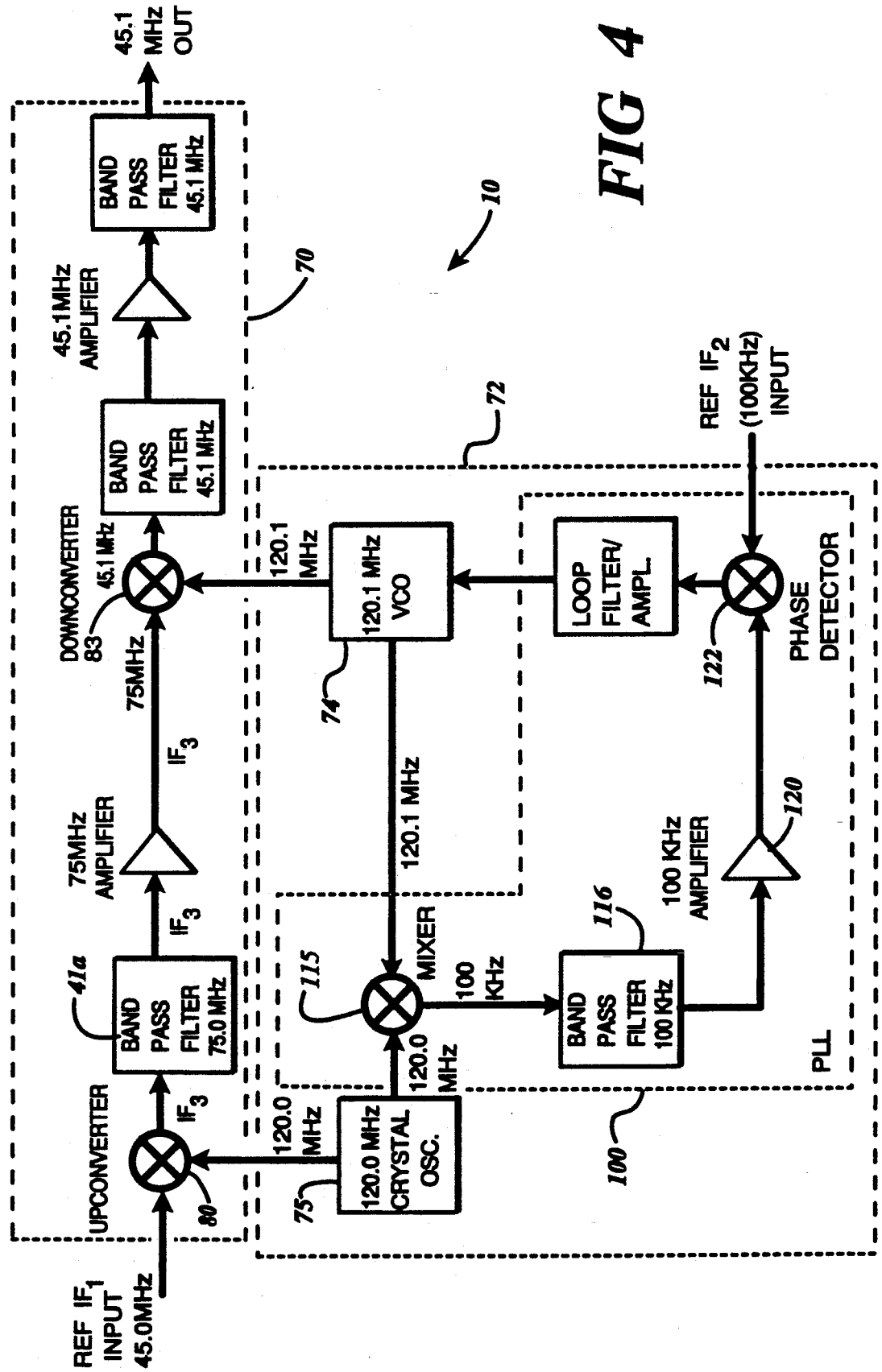
FIG. 4 is a block diagram of the frequency converter and oscillator/amplifier stage of the preferred offset frequency converter shown generally in FIG. 3.

Turning next to FIG. 4, the 120.0/120.1 oscillator/amplifier 72 includes a 120.1 MHz voltage control oscillator (VCO) assembly 74 which is phase-locked to a 120.0 MHz crystal oscillator assembly 75 with a frequency difference of 100 kHz. The 120.0 MHz signal may be considered as a first or upconversion IF LO signal, while the 120.1 signal may be considered a second or downconversion IF LO signal. These oscillators 74, 75 supply LO inputs to an upconverter or mixer 80 in the frequency converter 70, to convert the 45.0 MHz sampled reference signal REF $IF_1$ to a higher frequency signal at 75.0 MHz, and to a downconverter or mixer 83 which converts the 75.0 MHz to 45.1 MHz. The 75.0 MHz signal may be considered a third IF signal.

Figure 5:
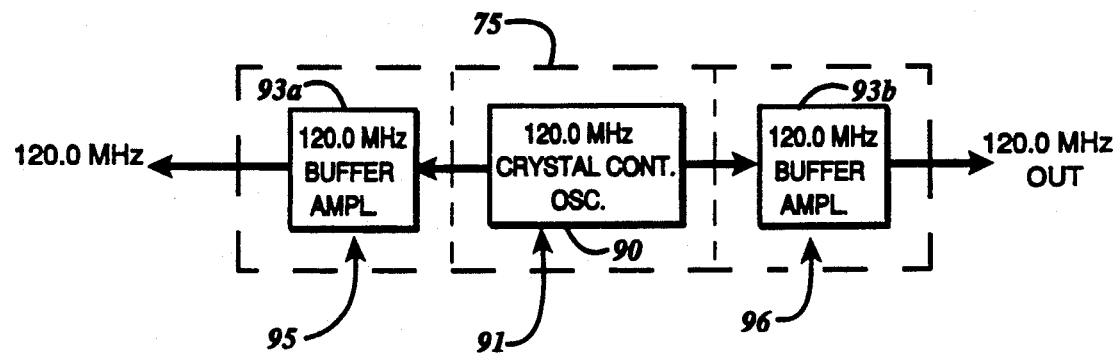
FIG. 5 is a block diagram of the 120.0 MHz crystal controlled oscillator employed in the preferred oscillator/amplifier stage shown in FIG. 4.

The 120.0 MHz crystal oscillator assembly 75 comprises three completely shielded compartments, as shown in FIG. 5. A 120.0 MHz crystal oscillator circuit 90 is located in a center shielded compartment 91. The oscillator's output is coupled to identical tuned buffer amplifier 93a, 93b located in separate shielded compartments 95, 96. These buffer amplifiers 93 provide high isolation between oscillator outputs. One buffer output is cabled to the mixer input of the 120.0/120.1 MHz oscillator phase locked loop circuit 100, shown in FIG. 7. The second buffer 93b output is coupled as the local oscillator input to the 45.0 MHz/75.0 MHz upconverter 80.

Figure 6:
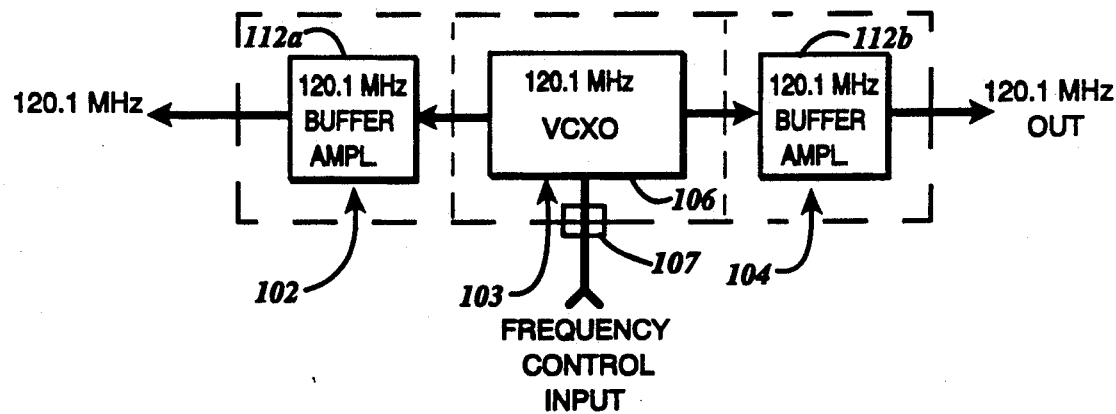
FIG. 6 is a block diagram of the 120.1 MHz voltage controlled oscillator employed in the preferred oscillator/amplifier stage shown in FIG. 4.

The 120.1 MHz VCO assembly 74 is shown more particularly in FIG. 6, and also includes three shielded compartments 102, 103, 104. The 120.1 MHz VCO circuit 106 is located in the center shielded compartment 103. A feed-through filter 107 couples a frequency control input voltage in the range of ±10 volts, denominated FREQUENCY CONTROL INPUT, to the VCO circuit 106.

The output of the VCO circuit 106 is coupled to two separate 120.1 MHz outputs through two separate tuned buffer amplifiers 112a, 112b. The amplifiers 112 provide isolation between the oscillator outputs. One output is coupled to the mixer of the 120.0/120.1 MHz phase locked loop circuit 100, shown in FIG. 7, while the second output is coupled as the LO input to the 75 MHz to 45.1 MHz downconverter 83 (FIG. 4).

Figure 7:
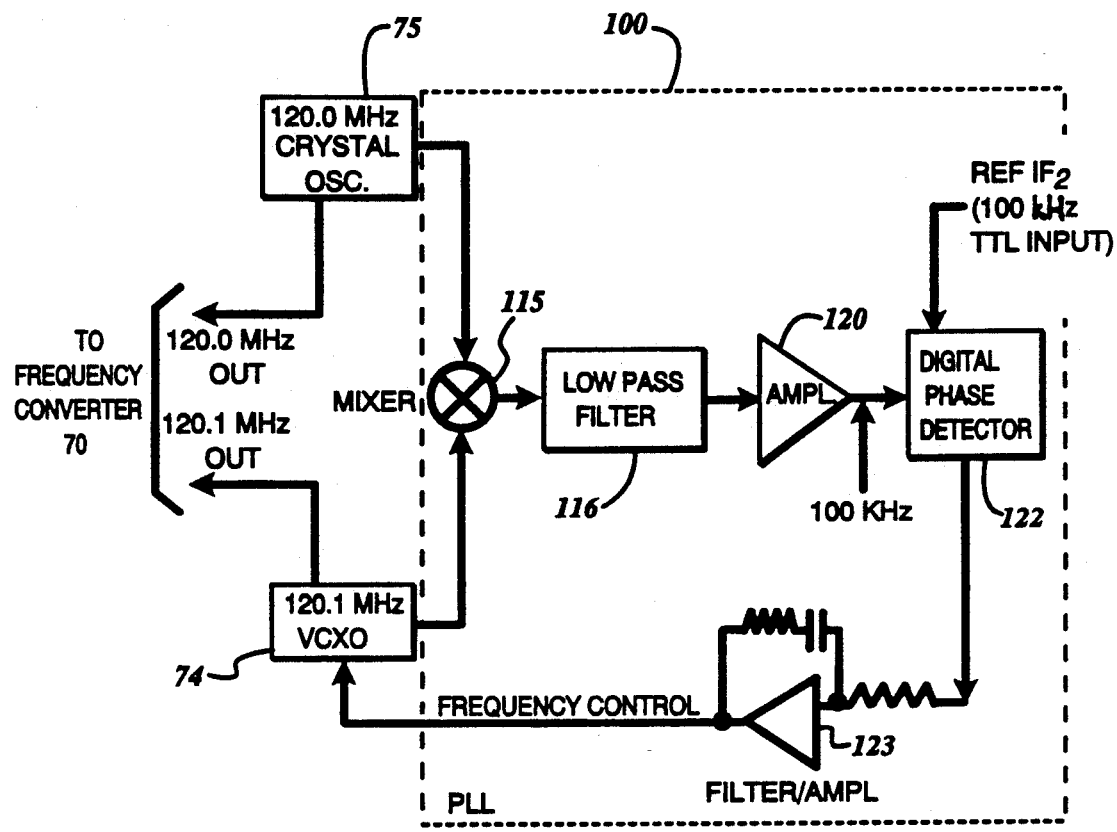
FIG. 7 is a block diagram of the phase locked loop circuit employed in the preferred oscillator/amplifier stage shown in FIG. 4.

Turning next to FIG. 7, the phase locked loop circuit 100 is operative to maintain a frequency difference of 100 kHz between the 120.0 MHz oscillator 75 and the 120.1 MHz VCO 74. The output from each oscillator 74, 75 is coupled to the inputs of a doubled balanced mixer 115. The difference frequency, nominally 100 kHz in the preferred embodiment, is passed through a 100 kHz low-pass filter 116, amplified by a 100 kHz minimum bandwidth amplifier 120, and compared at a phase detector 122 with the incoming TTL level 100 kHz reference signal input REF IF$_2$. This reference input signal REF IF$_2$ is a precision 100 kHz signal derived from the system 10 MHz clock, divided by 100 in the circuit 33 (FIG. 1), to provide a stable 100 kHz reference. Phase or frequency errors in the phase locked loop 100 cause an error signal to be generated, which is amplified by an operational amplifier 123 (with active loop filtering) and provided as a FREQUENCY CONTROL voltage which controls the VCO 74. In the manner known to those skilled in the art, the frequency of VCO 74 will vary proportionally with the FREQUENCY CONTROL signal to reduce the detected phase error.

Figure 8:
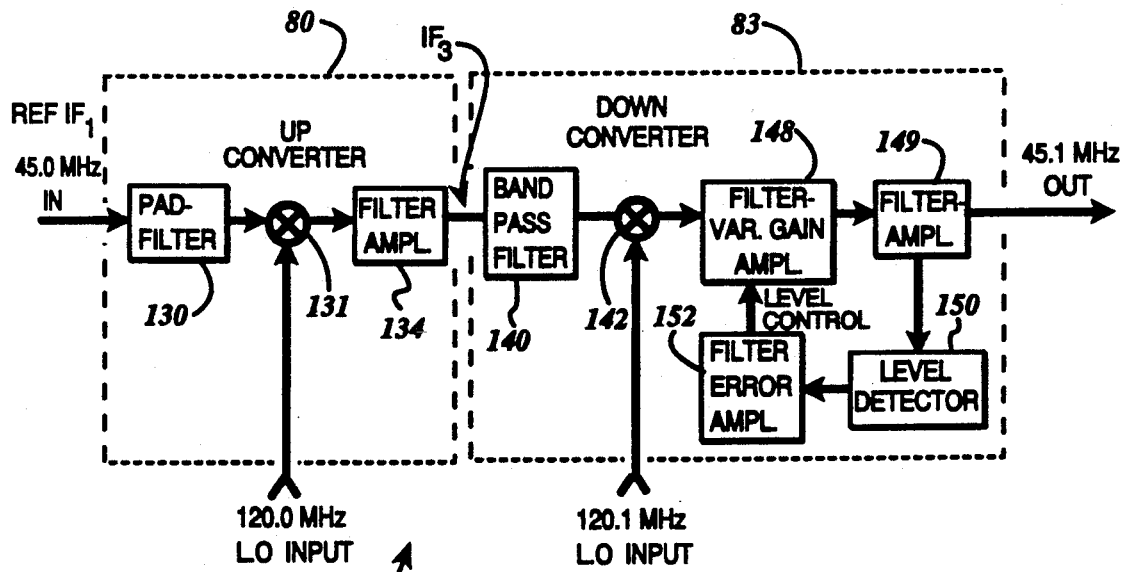
FIG. 8 is a block diagram of the 45.0 to 45.1 MHz frequency converter stage of the preferred offset frequency converter shown in FIG. 3.

Turning next to FIG. 8, the 45.0/45.1 MHz frequency converter 70 adds a stable 100 kHz frequency to an input signal within the 45.0 MHz±0.5 MHz frequency band. The 100 kHz frequency is derived from the frequency difference between the two inputs, the first upconversion LO signal at 120.0 MHz and the second downconversion LO signal at 120.1 MHz. The circuit 70 includes an upconverter 80, which receives the 45.0 MHz reference channel input sample signal REF IF$_1$. The input at 45.0 MHz is first attenuated and filtered by a pad and narrow bandpass filter 130 and then provided to a double-balanced mixer 131, where it is mixed with the 120.0 MHz LO signal from the oscillator 75, to obtain a third intermediate frequency signal IF$_3$, at 75.0 MHz signal. A filter/amplifier 134 boosts the signal and removes unwanted frequencies above and below 75.0 MHz.

The signal from the filter/amplifier 134, now at 75.0 MHz, is downconverted to 45.1 MHz in the downconverter circuit 83. The downconverter 83 comprises a narrow bandwidth bandpass filter 140 tuned to pass only a narrow band of frequencies around 75.0 MHz. The output of the bandpass filter 140 is provided to a double-balanced mixer 142 where it is mixed with the 120.1 MHz from the VCO 74, and downconverted to 45.1 MHz. The output 45.1 MHz signal is then provided to a series of stages comprising a variable gain amplifier 148, an active filter/amplifier 149, level detector 150, and a filter/error amplifier 152, so as to provide a 0 dBM output level, at 45.1 MHz. The circuits 148, 149, 150, and 152 comprise a slow acting leveling loop that maintain a constant output over the operating temperature range.

A sample of the output of the filter/amplifier 149 is supplied to the level detected 150. The level detector 150 supplies a DC output proportional to the signal amplitude. This DC output is compared to a preset reference DC voltage. Any difference between the detected DC voltage and the reference DC voltage is an error signal which is amplified by the filter/error amplifier 152 and supplied to the filter-variable gain amplifier 148 to reduce the error and maintain a constant signal output level.

It will now be appreciated that the described offset frequency converter 10 allows compensation of variations in frequency of the reference input channel to the IF processor 20, which may vary over a range of ±1 MHz or more, without requiring a coherent reference. The overall operational 3 dB bandwidth of the circuit as described is greater than 3 MHz, and can respond at a minimum of a 5 kHz rate, that is, it can maintain lock while the programmable local oscillators or frequency synthesizers step at minimum 5 kHz rates. Accordingly, the system will maintain lock even though continuous variations in frequency arrive on the reference input line REF IF$_1$, due to changes in either the frequency synthesizer 23 in the LO unit 21 or the frequency synthesizer 32 associated with the transmitter. The present circuit always adds a very precise and tightly controlled 100 kHz signal, to obtain a very clean 100 kHz second IF as an output.

It should be further understood that 75.0 MHz was chosen as the upconversion frequency for the 45.0/45.1 frequency converter stage 70 for use with a 45.0 MHz first intermediate frequency because of ease of filtration. An upconversion frequency of 75.0 MHz is far enough away from the second harmonic of 45 MHz to avoid filtration difficulties.

It will be further understood that the present invention provide means for conversion from a first intermediate frequency to a second, lower intermediate frequency in RF circuit applications without requiring a phase locked loop between the receiver and the transmitter. This is effected by providing double conversion instead of a slower-reacting RF phase locked loop, and only utilizing a phase locked loop in the IF stages to maintain a 100 kHz difference between signals provided from the 120.0/120.1 oscillator 72. This has proven to have far less criticality and is independent of the first intermediate frequency signal IF$_1$. Moreover, the invention allows more rapid response to frequency changes in the first IF channels, enables coherent operation with synthesized local oscillator sources without a common reference, allows utilization of harmonic mixing in subsequent stages of the receiver, and also allows high frequency agility.

The preferred embodiment of the present invention has been disclosed by way of example and it will be understood that other modifications may occur to those skilled in the art without departing from the scope and the spirit of the appended claims.

What is claimed is:

1. In or for a radio frequency apparatus, an intermediate frequency (IF) circuit for providing an IF output signal derived from a higher frequency input signal originating from a remote frequency source at a frequency coherent with a reference signal generated within said radio frequency apparatus, comprising:

a local oscillator including a programmably variable digital frequency synthesizer, said local oscillator being independent of said remote frequency source, said local oscillator providing said reference signal;

offset frequency converter means responsive to frequency differences within a predetermined range of frequencies between said reference signal and said input signal, for providing a stable mixing signal; and utilization means responsive to said input signal and said mixing signal to provide said IF output signal.

2. The IF circuit of claim 1, wherein said offset frequency converter is responsive to said input signal and a stable clock reference signal to provide said mixing signal which when supplied as a local oscillator frequency source to second converters in said IF circuit results in said IF output signal being coherent with said stable clock reference.

3. The IF circuit of claim 2, wherein said offset frequency converter comprises:

an oscillator circuit for providing an upconversion LO signal and a downconversion LO signal, said downconversion LO signal being different in frequency from said upconversion LO signal by said clock reference signal; and a frequency converter stage responsive to said upconversion LO signal, said downconversion LO signal, and said input signal to provide said IF output signal.

4. The IF circuit of claim 3, wherein said upconversion LO signal and said downconversion LO signals are higher in frequency than said input signal.

5. The IF circuit of claim 3, wherein said oscillator circuit comprises:

a fixed oscillator operative at said upconversion LO signal frequency;

a voltage-controlled oscillator responsive to a control voltage;

means responsive to said upconversion signal and said downconversion signal for obtaining a difference signal;

a phase locked loop operative to lock said difference signal to said clock reference signal and provide said control voltage, whereby said voltage-controlled oscillator provides said downconversion LO signal at the frequency of said upconversion signal plus said clock reference signal.

6. The IF circuit of claim 3, wherein said frequency converter stage comprises:

a frequency upconverter responsive to said input signal and said upconversion LO signal to provide a second upconverted IF signal ($IF_3$);

filter means for removing unwanted frequencies from said upconverted IF signal ($IF_3$); and a second frequency converter responsive to said upconverted IF signal ($IF_3$) and said downconversion LO signal to provide said output signal ($IF_1 + IF_2$).

7. The IF circuit of claim 6, wherein said upconverted IF signal ($IF_3$) is higher in frequency than the frequency of said input signal but lower than said upconversion LO signal.

8. The IF circuit of claim 6, wherein said upconversion signal is 120.0 MHz, wherein said upconverted IF signal ($IF_3$) is 75.0 MHz, and said input signal is nominally 45.0 MHz.

9. The IF circuit of claim 6, wherein said upconverted signal ($IF_3$) comprises a signal lower in frequency than the second harmonic of said input signal.

10. The IF circuit of claim 6, further comprising bandpass filter means subsequent to said second frequency converter for filtering unwanted frequencies resulting from the mixing process.

11. The IF circuit of claim 3, wherein said upconversion LO signal is lower by the frequency of said clock reference signal than said downconversion LO signal.

12. The IF circuit of claim 11, wherein said upconversion LO signal is 120.0 MHz and said clock reference signal is 100 kHz.

13. The IF circuit of claim 1, wherein said utilization means comprises an RF measurement receiver.

14. The IF circuit of claim 13, wherein said RF measurement receiver comprises a signal channel and a reference channel, and wherein said input signal is derived from said reference channel.

15. In or for a radio frequency receiver including a local oscillator stage having a frequency synthesizer for generating a local oscillator signal at steps of predetermined frequency increments and a harmonic mixer for mixing said local oscillator signal with an incoming RF signal from a remote frequency source independent of said local oscillator to obtain a downconverted intermediate frequency (IF) output signal, an improved high agility frequency converter, comprising:

means responsive to said local oscillator stage for mixing said local oscillator signal with said incoming signal to provide a first IF signal ($IF_1$)

means for sampling said $IF_1$ signal to provide a reference $IF_1$ signal;

means for providing a stable clock reference signal at a predetermined second IF frequency signal ($IF_2$);

offset frequency converter means responsive to said reference $IF_1$ signal and said second IF frequency signal for providing an $IF_1 + IF_2$ signal; and means for mixing said $IF_1 + IF_2$ signal with said first IF signal ($IF_1$) to provide said IF output signal at said second IF frequency $IF_2$, whereby said harmonic mixer may be utilized even when the receiver processes a signal from a transmitter which is non-coherent with respect to said local oscillator.

16. The frequency converter of claim 15, wherein said incoming signal is mixed with said local oscillator signal to provide a reference channel first IF signal ($IF_{1REF}$) and a signal channel first IF signal ($IF_{1SIG}$), and wherein said sampling means samples said reference channel first IF signal ($IF_{1REF}$).

17. The frequency converter of claim 15, wherein said incoming RF signal comprises a signal channel incoming RF signal derived from a test antenna and a reference channel incoming RF signal derived from a reference antenna, wherein said reference channel incoming RF signal is mixed with said local oscillator signal to provide a reference channel first IF signal ($IF_{1REF}$) and said signal channel incoming RF signal is mixed with said local oscillator signal to provide a signal channel first IF signal ($IF_{1SIG}$), and wherein said mixed $IF_1 + IF_2$ signal is mixed with both said $IF_{1REF}$ signal and said $IF_{1SIG}$ signal to obtain separate IF output signals $IF_{2REF}$ and $IF_{2SIG}$, both at said second IF frequency $IF_2$, such that $IF_{2REF}$ and $IF_{2SIG}$ are coherent in frequency but differ in phase and amplitude corresponding to differences in the signal channel incoming RF signal and reference channel incoming RF signal.

18. The frequency converter of claim 15, wherein said offset frequency converter comprises:
   an oscillator circuit for providing an upconversion LO signal and a downconversion LO signal,
   said downconversion LO signal being different in frequency from said upconversion LO signal by said clock reference signal; and
   a frequency converter stage responsive to said first upconversion LO signal, said downconversion LO signal, and said clock reference signal to provide said $IF_1 + IF_2$ output signal.

19. The frequency converter of claim 18, wherein said oscillator circuit comprises:
   a fixed oscillator operative at said upconversion LO frequency;
   a voltage-controlled oscillator responsive to a control voltage;
   means responsive to said upconversion LO signal and said downconversion LO signal for obtaining a difference signal;
   a phase locked loop operative to compare said difference signal to said clock reference signal and provide said control voltage,
   whereby said voltage-controlled oscillator provides said downconversion LO signal at the frequency of said upconversion LO signal plus said clock reference signal.

20. The frequency converter of claim 18, wherein said frequency converter stage comprises:
   a frequency upconverter responsive to said reference $IF_1$ signal and said upconversion LO signal to provide an upconverted IF signal ($IF_3$);
   filter means for removing unwanted frequencies resulting from the mixing process from said reference $IF_1$ signal; and
   a frequency downconverter responsive to said upconverted IF signal ($IF_3$) and said downconversion LO signal to provide said $IF_1 + IF_2$ output signal.

21. The frequency converter of claim 20, wherein said upconverted IF signal ($IF_3$) is higher in frequency than the frequency of said reference $IF_1$ signal but lower than said upconversion LO signal.

22. The frequency converter of claim 20, wherein said upconversion signal is 120.0 MHz, wherein said upconverted IF signal ($IF_3$) is 75.0 MHz, and said reference $IF_1$ signal is 45.0 MHz.

23. The frequency converter of claim 20, wherein said upconverted IF signal ($IF_3$) comprises a signal lower in frequency than the second harmonic of said reference $IF_1$ signal.

24. The frequency converter of claim 18, wherein said upconversion LO signal is lower by the frequency of said clock reference signal than said downconversion LO signal.

25. The frequency converter of claim 24, wherein said upconversion LO signal is 120.0 MHz and said clock reference signal is 100 kHz.

26. An intermediate frequency (IF) stage of a radio frequency (RF) antenna measurement receiver, said receiver being operative for measuring the characteristics of a test antenna which receives a transmitted signal at a first frequency derived from a remote frequency source, comprising:
   means for receiving a reference signal input from a reference antenna positioned to receive said transmitted signal;
   means for receiving a test signal input from an antenna under test positioned to receive said transmitted signal;
   a first reference channel IF means responsive to a receiver local oscillator signal derived from a receiver local oscillator independent of the remote frequency source, for downconverting said reference signal input into a first reference intermediate frequency ($IF_{1REF}$) signal;
   a first test channel IF means responsive to said receiver local oscillator signal for downconverting said test signal input into a first signal intermediate frequency ($IF_{1SIG}$) signal;
   sampling means for taking a sample of said $IF_{1REF}$ signal to provide an $IF_{1REF}$ sample signal;
   means for generating a second intermediate frequency reference signal (REF $IF_2$);
   offset frequency converter means responsive to said $IF_{1REF}$ sample signal and said REF $IF_2$ signal to provide a mixed $IF_1 + IF_2$ signal;
   means for splitting said $IF_1 + IF_2$ signal into two signal portions;
   means for mixing one portion of said $IF_1 + IF_2$ signal with said $IF_{1REF}$ signal to provide an intermediate frequency output signal associated with said reference signal input ($IF_{2REF}$); and
   means for mixing the other portion of said mixed $IF_1 + IF_2$ signal with said $IF_{1SIG}$ signal to provide an intermediate frequency output signal ($IF_{2SIG}$) associated with said test signal input,
   whereby said $IF_{2REF}$ signal and said $IF_{2SIG}$ signal are coherent in frequency notwithstanding a frequency difference between the receiver local oscillator signal from the receiver local oscillator and the transmitted signal from the remote frequency source.

27. The IF stage of claim 26, wherein said first reference IF means and said first test IF means comprises:
   a programmable local oscillator (LO) operative at discrete frequency intervals to provide a first LO signal;
   a power splitter for dividing said first LO signal into a LO signal for said first reference IF means and a LO signal for said first test IF means;
   a frequency mixer for mixing said first LO signal with said reference signal to obtain said first reference intermediate frequency ($IF_{1REF}$) signal; and
   a frequency mixer for mixing said first LO signal with said test signal to obtain said first signal intermediate frequency ($IF_{1SIG}$) signal.

28. The IF stage of claim 26, wherein said second IF reference signal (REF $IF_2$) is derived from a source independent of said transmitted signal.

29. The IF stage of claim 28, wherein said independent source comprises a stable clock oscillator.

30. The IF stage of claim 26, wherein said offset frequency converter comprises:
   an oscillator circuit for providing a upconversion LO signal and a downconversion LO signal,
   said downconversion LO signal being different in frequency by said second IF reference signal (REF $IF_2$); and
   a frequency converter stage responsive to said upconversion LO signal, said downconversion LO signal, and said IF$_{1REF}$ sample signal to provide said IF$_1$+IF$_2$ signal.

31. The IF stage of claim 30, wherein said oscillator circuit comprises:
   a fixed oscillator operative at said upconversion LO signal frequency;
   a voltage-controlled oscillator responsive to a control voltage;
   a mixer operative to mix said upconversion LO signal and said downconversion LO signal to obtain a difference signal; and
   a phase locked loop operative to lock said difference signal to said second IF reference signal (REF IF$_2$) and provide said control voltage,
   whereby said voltage-controlled oscillator provides said downconversion LO signal at the frequency of said upconversion LO signal plus said second IF reference signal (REF IF$_2$).

32. The IF stage of claim 30, wherein said frequency converter stage comprises:
   a frequency upconverter responsive to said IF$_{1REF}$ sample signal and said upconversion LO signal to provide an upconverted IF signal (IF$_3$);
   filter means for removing unwanted frequency components due to the mixing process from said upconverted IF signal (IF$_3$); and
   a frequency downconverter responsive to said upconverted IF signal (IF$_3$) and said downconversion LO signal to provide said IF$_1$+IF$_2$ output signal.

33. The IF stage of claim 32, wherein said upconverted IF signal (IF$_3$) is higher in frequency than the frequency of said IF$_{1REF}$ sample signal but lower than said upconversion LO signal.

34. The IF stage of claim 33, wherein said upconversion LO signal is 120.0 MHz, wherein said upconverted IF signal (IF$_3$) is 75.0 MHz, and said IF$_{1REF}$ sample signal is 45.0 MHz.

35. The IF stage of claim 32, wherein said upconverted IF signal (IF$_3$) comprises a signal lower in frequency than the second harmonic of said IF$_{1REF}$ sample signal.

36. The IF stage of claim 32, further comprising bandpass filter means subsequent to said frequency downconverter for filtering unwanted frequency components due to the mixing process from said IF$_1$+IF$_2$ output signal.

37. The IF stage of claim 30, wherein said upconversion LO signal is lower by the frequency of said second IF reference signal (REF IF$_2$) than said downconversion LO signal.

38. The IF stage of claim 37, wherein said upconversion LO signal is 120.0 MHz and said second IF reference signal (REF IF$_2$) is 100 kHz.

39. An offset frequency converter responsive to an input (IF$_{1REF}$) signal and a stable clock reference signal (REF IF$_2$) to provide an offset output (IF$_1$+IF$_2$) signal which is the sum of said input signal and said clock reference signal, comprising:
   means for providing a stable clock reference signal (REF IF$_2$);
   an oscillator circuit for providing an upconversion LO signal and a downconversion LO signal,
   said downconversion LO signal being different in frequency from said upconversion LO signal by said clock reference signal;
   means in said oscillator circuit for controlling the difference between said upconversion LO signal and said downconversion LO signal to the frequency of said stable clock reference signal; and
   a frequency converter stage responsive to said upconversion LO signal, said downconversion LO signal, and said input signal to provide said offset output signal.

40. The offset frequency converter of claim 39, wherein said upconversion LO signal and said downconversion LO signals are higher in frequency than said input signal.

41. The offset frequency converter of claim 39, wherein said oscillator circuit comprises:
   an fixed oscillator operative at said upconversion LO signal frequency;
   a voltage-controlled oscillator responsive to a control voltage;
   a mixer operative to mix said upconversion LO signal and said downconversion LO signal to obtain a difference signal;
   a phase locked loop operative to lock said difference signal to said clock reference signal and provide said control voltage,
   whereby said voltage-controlled oscillator provides said downconversion LO signal at the frequency of said upconversion LO signal plus said clock reference signal.

42. The offset frequency converter of claim 39, wherein said frequency converter stage comprises:
   a frequency upconverter responsive to said input signal and said upconversion LO signal to provide an upconverted IF signal (IF$_3$);
   filter means for removing unwanted frequencies due to the mixing process for said upconverted IF signal (IF$_3$); and
   a frequency downconverter responsive to said upconverted IF signal (IF$_3$) and said downconversion LO signal to provide said offset output signal.

43. The offset frequency converter of claim 42, wherein said upconverted IF signal (IF$_3$) is higher in frequency than the frequency of said input signal but lower than said upconversion LO signal.

44. The offset frequency converter of claim 43, wherein said upconversion LO signal is 120.0 MHz, wherein said upconverted IF signal (IF$_3$) is 75.0 MHz, and said input signal is nominally 45.0 MHz.

45. The offset frequency converter of claim 43, wherein said upconverted IF signal (IF$_3$) comprises a signal lower in frequency than the second harmonic of said input signal.

46. The offset frequency converter of claim 43, further comprising bandpass filter means subsequent to said frequency downconverter for filtering unwanted frequencies present in the mixing process from said offset output signal.

47. The offset frequency converter of claim 39, wherein said upconversion LO signal is lower by the frequency of said clock reference signal than said downconversion LO signal.

48. The offset frequency converter of claim 47, wherein said upconversion LO signal is 120.0 MHz and said clock reference signal is 100 kHz.

49. The IF circuit of claim 1, wherein said remote frequency source comprises a transmitting system including a second digital frequency synthesizer, and wherein said input signal comprises a signal derived from a test antenna operative for receiving signals transmitted from said transmitting system.

50. The IF circuit of claim 1, wherein said local oscillator provides a clock reference signal, and further comprising IF reference signal generating means responsive to said clock reference signal for providing said reference signal as an IF reference signal.

51. The offset frequency converter of claim 39, wherein said stable clock reference signal means comprises a local oscillator, and further comprising:

means for providing a first RF signal and a second RF signal both derived from a remote frequency source that is independent of said local oscillator; and means for mixing said offset output signal with said first RF signal and said second RF signal, whereby said first RF signal and said second RF signal are coherent in frequency relative to said local oscillator notwithstanding a frequency difference between said local oscillator and signals derived from said remote frequency source.

52. The offset frequency converter of claim 51, wherein said first RF signal is a signal channel signal in an antenna measurement receiver, and said second RF signal is a reference channel signal in said antenna measurement receiver.

53. The offset frequency converter of claim 39, wherein said difference controlling means comprises a phase locked loop for locking said downconversion LO signal to said stable clock reference signal.

* * * * *